United States Patent
Shimoda et al.

(10) Patent No.: US 6,602,347 B1
(45) Date of Patent: Aug. 5, 2003

(54) APPARATUS AND METHOD FOR PROCESSING A SUBSTRATE

(75) Inventors: Hiroshi Shimoda, Kyotanabe (JP); Masahiro Kanai, Tokyo (JP); Hirokazu Ohtoshi, Nara (JP); Tadashi Hori, Nara (JP); Koichiro Moriyama, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/439,609

(22) Filed: Nov. 12, 1999

(30) Foreign Application Priority Data

| Nov. 11, 1998 | (JP) | ............................................. 10-336524 |
| Nov. 8, 1999 | (JP) | ............................................. 11-316328 |

(51) Int. Cl.⁷ .......................... C23C 16/00; H05H 1/00; H05H 1/02
(52) U.S. Cl. ...................... 118/718; 118/712; 118/719; 156/345.24; 427/434.2
(58) Field of Search .................. 118/718, 712, 118/719, 729, 730, 731, 713, 714, 500; 156/345.24–345.25, 345.28; 427/434.2; 438/62, 50

(56) References Cited

U.S. PATENT DOCUMENTS

| 2,991,550 A | * | 7/1961 | Block .......................... 427/79 |
| 4,400,409 A | | 8/1983 | Izu et al. ...................... 427/39 |
| 4,485,125 A | | 11/1984 | Izu et al. ...................... 427/74 |
| 4,667,078 A | * | 5/1987 | Kilcher et al. ............ 219/69.12 |
| 4,728,406 A | * | 3/1988 | Banerjee et al. ........ 204/192.29 |
| 5,919,310 A | | 7/1999 | Fujioka et al. ............... 118/718 |

FOREIGN PATENT DOCUMENTS

| JP | 59-84516 A | * | 5/1984 | ......... H01L/21/205 |
| JP | 3-249638 A | * | 11/1991 | ........... G03B/27/46 |
| JP | 4-343240 A | * | 11/1992 | ........... H01L/21/60 |
| JP | 9-82652 | | 3/1997 | |
| JP | 10-158848 A | * | 6/1998 | ........... C23C/16/50 |
| JP | 2000-204478 A | * | 7/2000 | ........... C23C/16/54 |
| JP | 2001-36106 A | * | 2/2001 | ........... H01L/31/04 |
| JP | 2001-352149 A | * | 12/2001 | ............ H05K/3/10 |

* cited by examiner

*Primary Examiner*—Parviz Hassanzadeh
(74) *Attorney, Agent, or Firm*—Fitzpatrick, Cella, Harper & Scinto

(57) ABSTRACT

A substrate-processing apparatus includes a substrate delivery chamber, a substrate-processing chamber and a substrate takeup chamber, wherein in the substrate delivery chamber, a web substrate and an interleaf are delivered from a delivery bobbin including the web substrate and the interleaf alternately wound while the web substrate delivered is transported into the substrate-processing chamber to process the web substrate therein and the interleaf delivered is wound on an interleaf takeup bobbin. In the substrate takeup chamber, the web substrate transported from the substrate-processing chamber and an interleaf delivered from an interleaf delivery bobbin are alternately wound in a roll form on a substrate takeup bobbin. The substrate-processing apparatus is provided with a mechanism for detecting transport abnormality of the interleaf either in the substrate delivery chamber or in the substrate takeup chamber.

45 Claims, 6 Drawing Sheets

APPARATUS AND METHOD FOR PROCESSING A SUBSTRATE

BACKGROUND OF THE INVENTION

1. Field of the Invention

The present invention relates to an apparatus and method for processing a substrate for use in the production of a semiconductor device (the apparatus for processing a substrate will be hereinafter occasionally referred to as "substrate-processing apparatus" and the method for processing a substrate will be hereinafter occasionally referred to as "substrate-processing method" for simplification purpose). More particularly, the present invention relates to an improvement in the substrate-processing apparatus and substrate-processing method in which a substrate for a semiconductor device is wound in a roll form together with an interleaf before or after said substrate is treated. The substrate-processing apparatus includes a chemical vapor deposition (CVD) apparatus including a plasma CVD apparatus and the substrate-processing method includes a chemical vapor deposition (CVD) method including a plasma CVD method.

The present invention also relates to an apparatus and process for producing a photovoltaic element by way of CVD including plasma CVD.

2. Related Background Art

In recent years, various researches and developments have been conducted aiming at realization of sunlight power generation by means of a solar cell. In order to establish a definite situation for the sunlight power generation to meet the demand of electric power supply, it is required that solar cells having a sufficiently high photoelectric conversion efficiency and excelling in reliability are capable of being stably mass-produced and being always provided at a reasonable cost.

As such solar cell, public attention has been focused on an amorphous silicon (a-Si) solar cell (hereinafter referred to as "a-Si solar cell"), because the a-Si solar cell can be easily mass-produced at a reduced production cost and it can be stably provided at a reasonable cost, in comparison with a solar cell produced using a crystalline series silicon material or the like.

The reason for this is that the a-Si solar cell can be produced by using a raw material gas such as silane gas or the like which can be readily acquired at a reasonable cost and subjecting the raw material gas to glow discharge decomposition to form a functional deposited film such as a semiconductor film (or a semiconductor layer) or the like on a relatively inexpensive belt-like substrate (a substrate web) such as a metallic sheet or a resin sheet. And there have been proposed various film-forming method and apparatus for the production of an a-Si solar cell.

Incidentally, as such film-forming apparatus in order to form a functional deposited film as a semiconductor layer which is used in the production of a semiconductor device such as a solar cell, for instance, U.S. Pat. No. 4,400,409 (hereinafter referred to as document 1) discloses a plasma CVD continuous film-forming apparatus of a roll-to-roll system which can continuously form a functional deposited film as a semiconductor layer at a significant productivity. Document 1 describes that according to the plasma CVD continuous film-forming apparatus disclosed therein, it is possible to continuously form an element having a semiconductor junction by providing a long web member as a substrate on which a deposited film is to be formed and continuously moving in the longitudinal direction while passing said web member through a plurality of glow discharge regions to form a desired functional deposited film on said web member in each glow discharge region.

Besides, U.S. Pat. No. 4,485,125 (hereinafter referred to as document 2) discloses a method of continuously forming a deposited film on a long web member using a plasma CVD film-forming apparatus of a roll-to-roll system in which a substrate protective sheet is used such that said substrate protective sheet is laid on the surface of a deposited film formed on the web member. Document 2 describes that according to the film-forming method described therein, it is possible to continuously form a high quality deposited film on a long web member at good reproducibility and a high yield throughout from the beginning to the termination of the web member.

In addition, Japanese Unexamined Patent Publication No.82652/1997 (hereinafter referred to as document 3) discloses a method of forming a semiconductor film on a web substrate, including a step (a) of delivering a web substrate from a pay-out bobbin prior to forming a desired deposited film on said web substrate and a step (b) taking up said web substrate having said desired film formed thereon on e take-up bobbin through a steering roller while winding the web substrate winding on the take-up bobbin, wherein in said step (a) and said step (b), an interleaf comprising a resin, a chemical fiber or a glass wool is interposed between the web substrate and the steering roller in order to prevent occurrence of physical contact between the web substrate and the steering roller. Document 3 describes that according to the method described therein, shapes based on dusts or the like present on the back side of the web substrate are prevented from transferring onto the surface of the film formed on the web substrate and because of this, the surface of the film formed on the web substrate is prevented from being provided with irregularities.

However, the film-forming methods described in those documents have such subjects as will be described below, which are required to improve.

That is, for instance, in the case where the formation of a deposited film on a web substrate in accordance with the roll-to-roll film-forming manner is continuously conducted over a long period of time, in the step wherein the web substrate wound in a roll form on the bobbin together with the interleaf interposed in the roll form to cover the film-forming face of the web substrate is delivered from the bobbin and moved in the longitudinal direction for film formation while the interleaf being separately delivered and wound on the bobbin for the interleaf, when strong adhesion is present between the web substrate and the interleaf due to adhesion or electrostatic absorption of the interleaf, there is a fear such that the interleaf in pulled in the steering roller whereby the interleaf is sandwiched between the web substrate and the steering roller, where the interleaf is broken or the interleaf is in a state that the interleaf is mounted on the back face of the web substrate and it is moved into a first film-forming chamber adjacent to the substrate-delivering chamber together with the web substrate while maintaining said state.

Further, in the case where the rotation performance of a bobbin shaft for winding the interleaf fails due to aging of bearings for the bobbin shaft because of continuous repetition of the film formation over a long period of time and the winding speed of the interleaf becomes slower than the peeling speed of the interleaf from the web substrate, there is a fear such that the interleaf is gradually loosed and eventually, the interleaf is moved into a first film-forming chamber adjacent to the substrate-delivering chamber together with the web substrate while the interleaf being mounted on the back face of the web substrate.

When the interleaf is not normally wound, there is a tendency of causing problems such that abnormality is entailed for the transportation of the web substrate, and when the interleaf is taken into the first film-forming chamber as above described, depending upon the kind of the constituent of the interleaf, the interleaf is evaporated to deposit on the inner wall face or the like of the film-forming chamber or it is melted or burned in a worst case due to heat from the heater of the film-forming chamber, where the film-forming apparatus is greatly damaged.

Separately in the case where the web substrate having a plurality of deposited films sequentially formed thereon is wound on the bobbin, when the web substrate is wound on the bobbin together with a new interleaf while laying the interleaf on the film-forming surface of the web substrate so as to cover the film-forming surface and wherein the rotation performance of the bobbin shaft for delivering the interleaf fails and the speed for the interleaf to be delivered becomes faster than that for the web substrate to be wound on the bobbin, there is such a fear as will be described in the following. That is, the interleaf is gradually loosened and eventually, the interleaf is pulled in the steering roller in a state that the interleaf is mounted on the back face of the web substrate, where the interleaf is broken.

Without being noticed to the fact that the interleaf is broken during the film formation, when the film formation is continued, there is a tendency in that no interleaf is laid on the film-formed face of the web substrate which is wound after the time when the interleaf is broken. This situation is liable to entail a remarkable decrease in the yield of a film product and also in the characteristics thereof.

The occurrence of such problems as above described is limited only in the case of forming a deposited film on a web substrate by way of the roll-to-roll film-forming process. Similar problems are liable to occur also in the case of other substrate-processing apparatus in which a web substrate is treated by way of roll-to-roll manner. These substrate-processing apparatus include film-forming apparatus by means of sputtering, vapor deposition, CVD apparatus, plating, or coating, etching apparatus, and washing apparatus.

SUMMARY OF THE INVENTION

A principal object of the present invention is to eliminate the foregoing problems in the prior art and to provide an improved substrate-processing apparatus and method in which the foregoing troubles due to transport abnormality of the interleaf during the processing of a substrate (that is, the film formation on a substrate) which are found in the prior art are desirably eliminated.

Another object of the present invention is to provide a roll-to-roll film-forming apparatus and method which enable to efficiently form a high quality functional deposited film having satisfactory characteristics at an improved yield.

A further object of the present invention is to provide a roll-to-roll film-forming apparatus and method which enable to efficiently form a photovoltaic element including a solar cell having satisfactory characteristics.

A further object of the present invention is to provide a roll-to-roll substrate-processing apparatus comprising a substrate delivery chamber having a substrate delivery means having a web substrate (that is, a belt-like shaped long substrate) and an interleaf alternately wound and an interleaf takeup means which are provided therein, a substrate processing chamber (of a single- or multi-chambered system), and a substrate takeup chamber having a substrate takeup means and an interleaf delivery means having an interleaf wound thereon which are provided therein, wherein said substrate web and said interleaf are continuously delivered from said substrate delivery means where said interleaf delivered is continuously wound on said interleaf takeup means and said web substrate delivered is continuously transported into a substrate-processing chamber through a steering roller where said web substrate is subjected to desired processing, the web substrate processed in the substrate-processing chamber is continuously transported into said substrate takeup chamber where the web substrate is wound through a steering roller on said substrate takeup means together with an interleaf delivered from said interleaf delivery means such that the web substrate and the interleaf are alternately wound on the substrate takeup means, wherein said substrate-processing apparatus is provided with a mechanism to detect transport abnormality of the interleaf in the substrate delivery chamber or/and the substrate takeup chamber whereby preventing the interleaf from suffering adhesion to the web substrate and also preventing the interleaf from being taken into the substrate processing chamber together with the web substrate.

The term "adhesion" in the present invention indicates a state in that the interleaf and the substrate are contacted with each other. The present invention is aimed at detecting and preventing such contact (adhesion). Specifically, the present invention is aimed at preventing the interleaf from being transported in a state of being contacted (adhered) with the substrate.

According to the substrate-processing apparatus of the present invention, it is possible that a web substrate is continuously transported from the substrate delivery chamber into the substrate processing chamber while preventing the web substrate from being contacted with an interleaf which is delivered together with the web substrate where desired processing such as film formation is efficiently performed on the web substrate which is moving, and the substrate web thus processed in the substrate processing chamber is successively transported into the substrate takeup chamber where the web substrate is wound on the substrate takeup means while the processed surface of the web substrate being covered by an interleaf which is separately delivered without being contacted with the web substrate. Thus, there can be effectively obtained a rolled product comprising a web substrate having a processed surface (or having a deposited film formed thereon) and an interleaf which are alternately wound such that the processed surface (or the deposited film-bearing surface) of the web substrate is covered by the interleaf. This situation enables to efficiently and continuously form not only a high quality functional deposited film having satisfactory characteristics but also a high quality photovoltaic element (solar cell) having satisfactory characteristics on a web substrate at an improved yield.

The present invention also makes it an object to provide a substrate-processing method using the above substrate-processing apparatus.

DESCRIPTION OF THE INVENTION AND PREFERRED EMBODIMENTS

Figure 1:
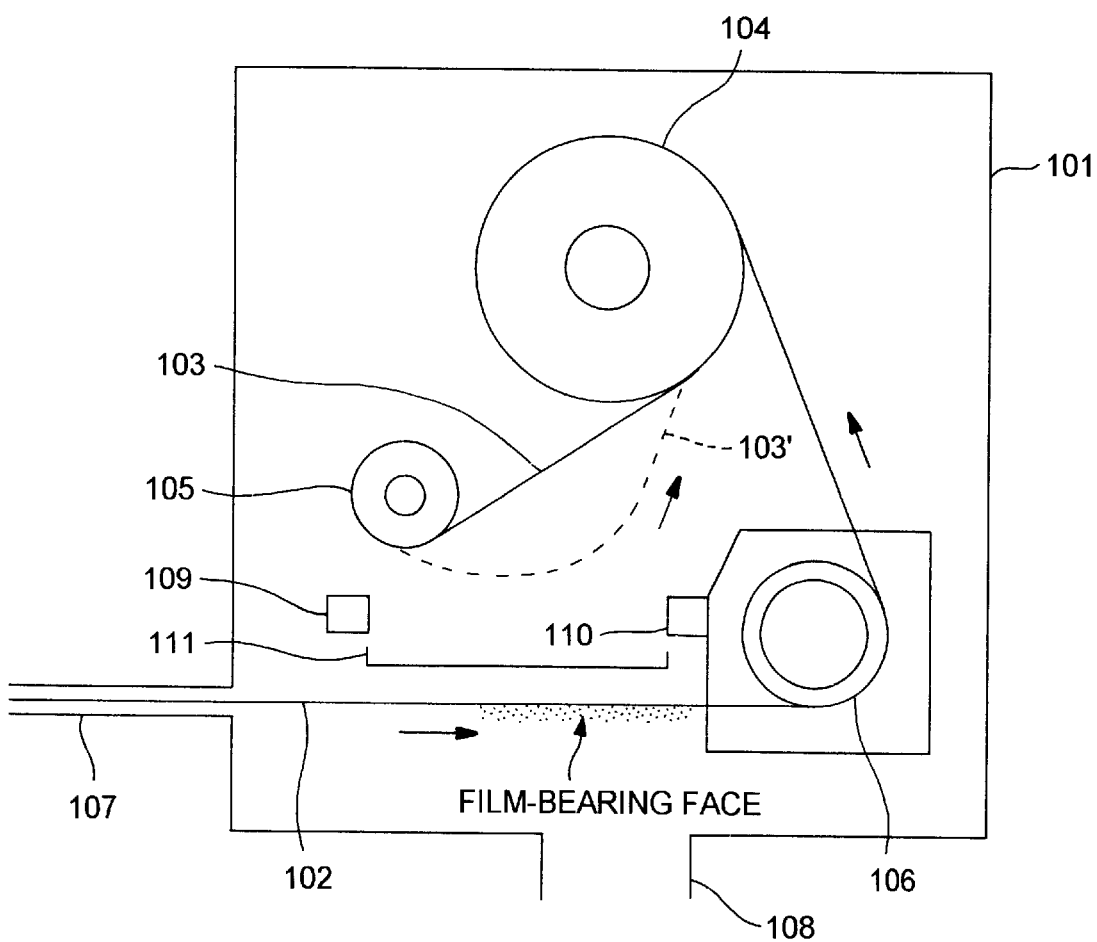
FIG. 1 is a schematic diagram illustrating an inside constitution of an example of a substrate takeup chamber as a part of a substrate-processing apparatus according to the present invention.

The present invention eliminates the foregoing problems found in the prior art and attain the above described objects.

As previously described, the present invention typically provides a substrate-processing apparatus comprising a substrate delivery chamber having a substrate delivery means having a web substrate (that is, a belt-like shaped long substrate) and an interleaf alternately wound and an interleaf takeup means which are provided therein, a substrate processing chamber (of a single- or multi-chambered system), and a substrate takeup chamber having a substrate takeup means and an interleaf delivery means having an interleaf wound thereon which are provided therein, wherein said substrate web and said interleaf are continuously delivered from said substrate delivery means where said interleaf delivered is continuously wound on said interleaf takeup means and said web substrate delivered is continuously transported into a substrate-processing chamber through a steering roller where said web substrate is subjected to desired processing, the web substrate processed in the substrate-processing chamber is continuously transported into said substrate takeup chamber where the web substrate is wound through a steering roller on said substrate takeup means together with an interleaf delivered from said interleaf delivery means such that the web substrate and the interleaf are alternately wound on the substrate takeup means, wherein said substrate-processing apparatus is provided with a mechanism to detect transport abnormality of the interleaf in the substrate delivery chamber or/and the substrate takeup chamber whereby preventing the interleaf from suffering adhesion to the web substrate and also preventing the interleaf from being taken into the substrate processing chamber together with the web substrate.

As previously described, this substrate-processing apparatus makes it possible that a web substrate is continuously transported from the substrate delivery chamber into the substrate processing chamber while preventing the web substrate from being contacted with an interleaf which is delivered together with the web substrate where desired processing such as film formation is efficiently performed on the web substrate which is moving, and the substrate web thus processed in the substrate processing chamber is successively transported into the substrate takeup chamber where the web substrate is wound on the substrate takeup means while the processed surface of the web substrate being covered by an interleaf which is separately delivered without being contacted with the web substrate. Thus, there can be effectively obtained a rolled product comprising a web substrate having a processed surface (or having a deposited film formed thereon) and an interleaf which are alternately wound such that the processed surface (or the deposited film-bearing surface) of the web substrate is covered by the interleaf. This situation enables to efficiently and continuously form not only a high quality functional deposited film having satisfactory characteristics but also a high quality photovoltaic element (solar cell) having satisfactory characteristics on a web substrate at an improved yield.

The present invention also provides a substrate-processing method using the above substrate-processing apparatus.

The present invention includes the following aspects.

A first aspect of the present invention provides a substrate-processing apparatus comprising at least a substrate delivery chamber and a substrate-processing chamber, said substrate delivery chamber having a substrate delivery bobbin and an interleaf takeup bobbin provided therein, said substrate delivery bobbin having a roll comprising a web substrate and an interleaf alternately wound thereon, wherein in said substrate delivery chamber, said web substrate and said interleaf are delivered from said substrate delivery bobbin while said web substrate delivered is transported into said substrate-processing chamber and said interleaf delivered is wound on said interleaf takeup bobbin, said web substrate transported into said substrate-processing chamber is subjected to desired processing in said substrate-processing chamber, characterized in that said substrate-processing apparatus is provided with a mechanism for detecting transport abnormality of the interleaf in the substrate delivery chamber.

A second aspect of the present invention provides a substrate-processing apparatus comprising at least a substrate-processing chamber for processing a web substrate therein and a substrate takeup chamber having a substrate takeup bobbin and an interleaf delivery bobbin, wherein said web substrate processed in said substrate-processing chamber is transported into said substrate takeup chamber where said web substrate and an interleaf delivered from said interleaf delivery bobbin are alternately wound on said substrate takeup bobbin in a roll form, characterized in that said substrate-processing apparatus is provided with a mechanism for detecting transport abnormality of the interleaf in the substrate takeup chamber.

A third aspect of the present invention provides a substrate-processing apparatus comprising at least a substrate delivery chamber having a substrate delivery bobbin and an interleaf takeup bobbin provided therein, said substrate delivery bobbin having a roll comprising a web substrate and an interleaf alternately wound;

a substrate-processing chamber for processing said web substrate therein; and a substrate takeup chamber having a substrate takeup bobbin and an interleaf delivery bobbin provided therein, wherein in said substrate delivery chamber, said web substrate and said interleaf are delivered from said substrate delivery bobbin while said web substrate delivered is transported into said substrate-processing chamber and said interleaf delivered is wound on said interleaf takeup bobbin; said web substrate processed in said substrate-processing chamber is transported into said substrate takeup chamber, where said web substrate and an interleaf delivered from said interleaf delivery bobbin are alternately wound in a roll form on said substrate takeup bobbin, characterized in that said substrate-processing apparatus is provided with at least either a mechanism for detecting transport abnormality of the interleaf in the substrate delivery chamber or a mechanism for detecting transport abnormality of the interleaf in the substrate takeup chamber.

A fourth aspect of the present invention provides a substrate-processing method comprising at least (a) a step of delivering a web substrate and an interleaf from a substrate delivery bobbin provided in a substrate delivery chamber while said web substrate delivered from said substrate delivery bobbin is transported into a substrate-processing chamber and said interleaf delivered from said substrate delivery bobbin is wound on an interleaf takeup bobbin, said substrate delivery bobbin having a roll comprising said web substrate and said interleaf alternately wound, and (b) a step of subjecting said web substrate transported into said substrate-processing chamber to desired processing in said substrate-processing chamber, characterized in that in said step (a), transport abnormality of said interleaf in said substrate delivery chamber is detected by means of a transport abnormality-detecting mechanism.

A fifth aspect of the present invention provides a substrate-processing method comprising at least (a) a step of introducing a web substrate into a substrate-processing chamber, where said web substrate is subjected to desired processing in said substrate-processing chamber, and (b) a step of transporting said web substrate processed in said substrate-processing chamber into a substrate takeup chamber, where said web substrate is wound on a substrate takeup bobbin provided in said substrate takeup chamber together with an interleaf delivered from an interleaf delivery bobbin provided in said substrate takeup chamber such that said web substrate and said interleaf are alternately wound in a roll form, characterized in that in said step (b), transport abnormality of said interleaf in said substrate takeup chamber is detected by means of a transport abnormality-detecting mechanism.

A sixth aspect of the present invention provides a substrate-processing method comprising at least (a) a step of delivering a web substrate and an interleaf from a substrate delivery bobbin provided in a substrate delivery chamber while said web substrate delivered from said substrate delivery bobbin is transported into a substrate-processing chamber and said interleaf delivered from said substrate delivery bobbin is wound on an interleaf takeup bobbin, said substrate delivery bobbin having a roll comprising said web substrate and said interleaf alternately wound, (b) a step of subjecting said web substrate transported into said substrate-processing chamber to desired processing in said substrate-processing chamber, and (c) a step of transporting said substrate web processed in said substrate-processing chamber into a substrate takeup chamber, where said web substrate is wound on a substrate takeup bobbin provided in said substrate takeup chamber together with an interleaf delivered from an interleaf delivery bobbin provided in said substrate takeup chamber such that said web substrate and said interleaf are alternately wound in a roll form, characterized in that in said step (a) or/and said step (c), transport abnormality of said interleaf in said substrate delivery chamber or/and said substrate takeup chamber is detected by means of a transport abnormality-detecting mechanism.

The mechanism of detecting transport abnormality of the interleaf in the present invention is desired to comprise a means for slack of the interleaf between the substrate delivery bobbin and the interleaf takeup bobbin in the substrate delivery chamber or/and a means for detecting slack of the interleaf between the interleaf delivery bobbin and the substrate takeup bobbin in the substrate takeup chamber. The term "slack" in the present invention is meant to include deflection.

The mechanism of detecting transport abnormality of the interleaf in the present invention may comprise a means for detecting adhesion between the web substrate and the interleaf. Further, The mechanism or means of detecting transport abnormality of the interleaf in the present invention may comprises a means for detecting rotation abnormality of the interleaf takeup bobbin or/and the interleaf delivery bobbin.

In any case, the transport abnormality-detecting mechanism may comprise a photo sensors, a physical sensor, or a rotation frequency detector for the interleaf takeup bobbin. Specifically, the transport abnormality-detecting mechanism may comprise a laser sensor or a limit switch.

In the present invention, it is desired for the substrate-processing apparatus to have a mechanism of preventing the interleaf from contacting with the web substrate at a portion other than the roll. Such mechanism may comprise a tray, a mesh or a bar-like member. It is possible that said mechanism and the transport abnormality-detecting mechanism comprises a common member.

The substrate-processing in the present invention includes film formation on a substrate, plasma processing of a substrate, and processing of a substrate including heat-treatment of said substrate. Representative specific examples of such substrate-processing are plasma chemical vapor deposition (plasma CVD) and sputtering.

Now, in the present invention, because such constitution as above described is employed, in the substrate delivery chamber, by detecting adhesion, electrostatic absorption or the like between the interleaf and the web substrate before the steering roller or by detecting slack of the interleaf, it is possible to previously prevent the interleaf from being taken into the substrate processing chamber situated next to the substrate delivery chamber which will be occurred when the winding of the interleaf becomes abnormal, whereby the roll-to-roll type substrate-processing apparatus can be maintained without being damaged due to transport abnormality of the interleaf. Further, in the substrate takeup chamber, by detecting pause of the interleaf which will be occurred when the interleaf is broken due to internal components such as the steering roller and the like in the substrate takeup chamber and terminating the transportation of the web substrate when the pause of the interleaf is occurred, whereby it is possible to previously prevent the yield and characteristics for the processed web substrate after the occurrence of the breakage at the interleaf from being decreased.

Thus, the present invention realizes a substrate-processing apparatus and a substrate-processing method which enable to improve not only the yield when a web substrate is processed but also the characteristics of a processed web substrate obtained. Particularly, the present invention realizes a film-forming apparatus and a film-forming method which enable to continuously and efficiently form not only a functional deposited film having satisfactory characteristics but also a photovoltaic element such as a solar cell having satisfactory characteristics on a web substrate at an improved yield.

The present invention includes a roll-to-roll type substrate-processing apparatus having at least either a mechanism of delivering a web substrate and an interleaf from a roll comprising said web substrate and said interleaf alternately wound and processing said web substrate or a mechanism of winding a processed substrate together with an interleaf in a roll form.

The substrate-processing apparatus can include roll-to-roll type film-forming apparatus such as a roll-to-roll type sputtering apparatus, a roll-to-roll type vacuum evaporation apparatus, a roll-to-roll type chemical vapor deposition (CVD) apparatus, a roll-to-roll type plating apparatus, and a roll-to-roll type coating apparatus, a roll-to-roll type etching apparatus, and a roll-to-roll type washing apparatus.

Further, The present invention includes a substrate-processing method having at least either a step of delivering a web substrate and an interleaf from a roll comprising said web substrate-and said interleaf alternately wound and processing said web substrate or a step of winding a processed substrate together with an interleaf in a roll form.

The substrate-processing method can include film-forming method such a sputtering method, a vacuum evaporation method, a chemical vapor deposition (CVD) method, a plating method, and a coating method, an etching method, and a washing method.

The present invention is particularly effective when applied in the film-forming apparatus or method, especially when applied in the film-forming apparatus or method for forming a functional deposited film such as a semiconductor film. The reason for this is that transport abnormality of the interleaf is liable to impart various adverse effects to the characteristics of a film formed. Further, the transport abnormality of the interleaf is liable to impart various adverse effects to plasma. Therefore, the present invention is greatly effective when applied in the apparatus or method of processing a substrate using plasma. In addition, the present invention is also effective when applied in the substate-processing apparatus or method in which a thermal energy is used.

In the following, description will be made of the contents of the transport abnormality of the interleaf and the mechanism of detecting the transport abnormality of the interleaf in the present invention.

Slack Abnormality of Interleaf

Description will be made with reference to a typical example comprising a substrate takeup chamber in a roll-to-roll plasma CVD apparatus in which an electrically conductive web substrate is delivered, a plurality of functional films are sequentially formed on the web substrate delivered, and the web substrate having the functional deposited films formed thereon is wound together with an interleaf in a roll form such that the interleaf is wound to lay on the film-bearing surface of the web substrate.

FIG. 1 is a schematic diagram illustrating an inside constitution of the substrate takeup chamber. In FIG. 1, reference numeral 101 indicates the substrate takeup chamber, reference numeral 102 a web substrate, reference numeral 103 an interleaf in a normal state, reference numeral 103'0 an interleaf in an abnormal state (a deflected state), reference numeral 104 a substrate takeup bobbin, reference numeral 105 an interleaf delivery bobbin, reference numeral 106 a steering roller, reference numeral 107 a gas gate, reference numeral 108 an exhaust pipe, reference numeral 109 a light emitting laser sensor, reference numeral 110 a light receiving laser sensor, and reference numeral 111 a tray as a mechanism of preventing a deflected interleaf 103 from contacting with the web substrate 102.

In this embodiment, the web substrate 102 comprises a 0.15 mm thick SUS 4302 D web substrate of 355.6 mm in width and 1000 m in length. The web substrate is moved in a transportation direction shown by an arrow mark in FIG. 1 at a transportation speed of 1270 mm/minute while applying a tensile force of 80 Kg to the web substrate in the transportation direction. The interleaf 103 comprises a 0.05 mm thick polyimide film of 355.6 mm in width and 1000 m in length. The interleaf is arranged such that it is enfolded onto a film-forming face of the web substrate as shown by a solid line 103 in FIG. 1.

Under this condition, in the step wherein while the substrate web having a plurality of deposited films sequentially formed thereon is wound on the substrate takeup bobbin 104, a new interleaf 103 is delivered from the interleaf delivery bobbin and is enfolded onto the film-bearing face of the web substrate, there is a fear of entailing such problem as will be described below.

That is, in the case where continuous film formation on the web substrate while moving the web substrate in the transportation direction is repeatedly conducted over a long period of time, when the rotation performance of the shaft of the interleaf delivery bobbin 105 fails due to deterioration and the like of the bearings and the speed for the interleaf to be enfolded becomes slower than that for the web substrate to be wound on the substrate takeup bobbin 104, the interleaf starts gradually slacking and it eventually becomes to be in a state shown by a broken line 103' in FIG. 1.

In order to prevent occurrence of such problem as described in the above, a pair of a light emitting laser sensor 109 and a light receiving 110 laser sensor are arranged at respective prescribed positions as shown in FIG. 1 so that when the deflected interleaf crosses between the two laser sensors, an alarm is given and abnormality contents are indicated on a display panel (not shown), and when this crossing state of the interleaf between the two laser sensors is continued for more than 0.5 seconds, the discharge in all of the discharging chambers, the transportation of the web substrate and the rotation of the interleaf delivery bobbin are suspended. This constitution enables to prevent occurrence of a problem in that the deflected interleaf is mounted on the back face of the web substrate and pulled in the steering roller 106 whereby the interleaf is broken. And even when the process of processing the web substrate is suspended due to transport abnormality (slack abnormality) of the interleaf as above described, the cause of the transport abnormality of the interleaf can be promptly repaired by returning the interleaf to be in a normal state, where the process of processing the web substrate can be promptly restarted.

In this embodiment, as above described, the two laser sensor were used as. the means of detecting transport abnormality of the interleaf (or as the means of detecting slack of the interleaf).

Besides, other photo sensors and physical sensors such as limit switch capable of detecting a fact when the interleaf is contacted with a given detecting portion may be selectively used.

For the position for the sensors as the means of detecting transport abnormality of the interleaf to be arranged, they are desired to be arranged at respective positions which are below the transportation path of the interleaf between the interleaf delivery bobbin and the substrate takeup bobbin and which do not hinder normal transportation of the interleaf.

Figure 2:
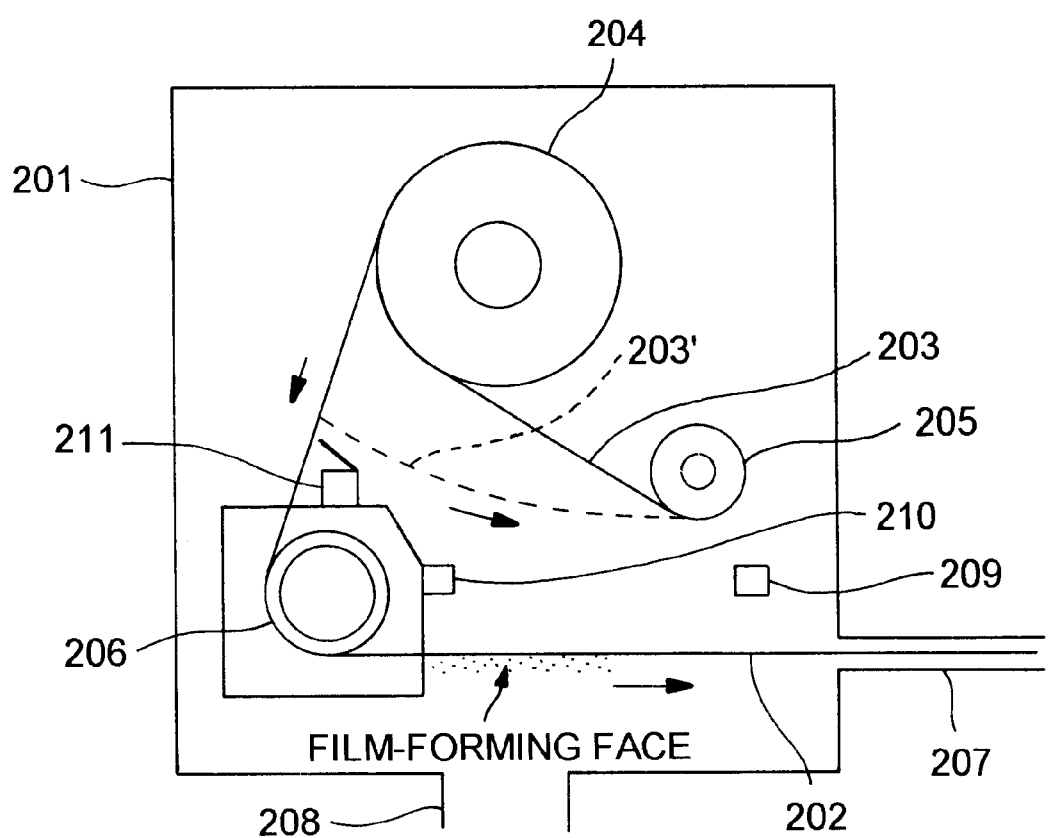
FIG. 2 is a schematic diagram illustrating an inside constitution of an example of a substrate delivery chamber as a part of a substrate-processing apparatus according to the present invention.

When such sensors as above described are arranged in such substrate delivery chamber as shown in FIG. 2 which will be later described, they are desired to be arranged at respective positions which are blow the transportation path of an interleaf between a substrate delivery bobbin and an interleaf takeup bobbin and which do not hinder normal transportation of the interleaf.

In the case where the sensors are arranged at said positions, the constitution detects a fact when the interleaf is present at a position where the interleaf is not be present. On the other hand, it is possible to take such a constitution as to detect a fact when the interleaf is present at a position where the interleaf is to be present. As an example in this case, there can be illustrated a constitution in that a pair of a light emitting laser sensor and a light receiving laser sensor are arranged between the interleaf delivery bobbin and the substrate takeup bobbin (or between the substrate delivery bobbin and the interleaf takeup bobbin) so as to sandwich the transportation path of the interleaf.

In a preferred embodiment, there is provided a mechanism comprising, for instance, a tray 111 (see, FIG. 1) for preventing the interleaf from contacting with the web substrate. This mechanism may comprise, besides said tray, a mesh member, a bar-like member or the like. Alternatively, it is possible for the mechanism to be integrated with a physical sensor or the like so that the mechanism can serve also as a means of detecting transport abnormality of the interleaf.

Adhesion Abnormality of Interleaf

Description will be made with reference to a typical example comprising a substrate delivery chamber in a roll-to-roll type plasma CVD apparatus in which an electrically conductive web substrate is delivered from a roll comprising said electrically conductive web substrate and an interleaf alternately wound, a plurality of functional films are sequentially formed on the web substrate delivered.

FIG. 2 is a schematic diagram illustrating an inside constitution of the substrate delivery chamber.

In FIG. 2, reference numeral 201 indicates the substrate delivery-chamber, reference numeral 202 a web substrate, reference numeral 203 an interleaf in a normal state, reference numeral 203' an interleaf in an abnormal state (a slacked state), reference numeral 204 a substrate delivery bobbin, reference numeral 205 an interleaf takeup bobbin, reference numeral 206 a steering roller, reference numeral 207 a gas gate, reference numeral 208 an exhaust pipe, reference numeral 209 a light emitting laser sensor, reference numeral 210 a light receiving laser sensor, and reference numeral 211 a limit switch.

In the step wherein while the substrate web 202 prior to sequentially forming a plurality of deposited film thereon is delivered and the interleaf 203 is wound on the interleaf takeup bobbin 205, when strong adhesion is present between the web substrate 202 and the interleaf 203 due to adhesion or electrostatic absorption of the interleaf, there is a fear such that the interleaf which is usually in a state shown by a solid line 203 in FIG. 2 becomes in such a state as shown by a broken line 203' in FIG. 2 and the interleaf is pulled in the steering roller 206, whereby the interleaf is sandwiched between the web substrate and the steering roller, where the interleaf is broken or the interleaf is in a state such that the interleaf is mounted on the back face of the web substrate and it is moved into a first film-forming chamber (not shown) situated next to the substrate delivery chamber together with the web substrate while maintaining this state.

In order to prevent occurrence of such problem as above described, in addition to the laser sensors 209 and 210, the limit switch 211 is arranged at a position above the steering roller 206 as shown in FIG. 2 so that when the interleaf adhered to the web substrate taps the limit switch, an alarm is given and abnormality contents are indicated on a display panel (not shown), and when the state of tapping the limit switch is continued for more than 0.5 second, the discharge in all of the discharging chambers, the transportation of the web substrate and the rotation of the interleaf takeup bobbin are suspended. By this, it is possible to prevent occurrence of a problem in that the breakage of the interleaf due to the adhesion of the interleaf to the web substrate or the interleaf is taken into the first film-forming chamber situated next to the substrate delivery chamber. And even when the process of processing the web substrate is suspended due to transport abnormality (adhesion abnormality) of the interleaf as above described, the cause of the transport abnormality of the interleaf can be promptly repaired by returning the interleaf to be in a normal state, where the process of processing the web substrate can be promptly restarted.

In this embodiment, instead of the limit switch or in combination with the laser sensors, it is possible to use any of the foregoing transport abnormality-detecting mechanism. It is also possible to use the foregoing mechanism of preventing the interleaf from contacting with the web substrate.

Further, in the case where there is considered an occasion such that the interleaf will be broken due to a certain cause and the interleaf which is originally to be wounded on the interleaf takeup bobbin will be transported while being adhered to the web substrate, it is desired to examine whether or not foreign matter (the interleaf) is adhered on the surface of the web substrate by using a photo sensor or the like capable of detecting light reflected from the surface of the web substrate instead of or in addition to the limit switch.

In the case where such photo sensor capable of detecting light reflected from the substrate is installed in the substrate-processing apparatus having such substrate transportation path as shown in FIG. 1 or FIG. 2, it is desired to arrange a photo sensor having a light emitting portion and a light receiving portion so that light emitted from the light emitting portion of the photo sensor is irradiated to the web substrate and light reflected from the web substrate is impinged in the light receiving portion of the photo sensor. For the position for the photo sensor to be arranged in the substrate delivery chamber, it is desired to be a position above the substrate transportation path in the vicinity of the gas gate 207 (that is, immediately before the web substrate gets in the gas gate) in a viewpoint of preventing the interleaf from entering in the processing chamber (or the film-forming chamber) and also a position above the right side of the substrate transportation path between the substrate delivery bobbin 204 and the steering roller 206 in a viewpoint of preventing the interleaf from being taken in the steering roller and broken. It is preferred that said photo sensor is arranged at each of these two positions. In the case of the substrate takeup chamber, it is preferred that the photo sensor is arranged at a position above the substrate transportation path in the vicinity of the steering roller 106 (that is, immediately before the web substrate reaches the steering roller).

Revolution Abnormality of Interleaf Bobbin

Description will be made of a means of detecting revolution abnormality of the interleaf delivery bobbin 105 shown in FIG. 1 or the interleaf takeup bobbin 205 shown in FIG. 2 in the substrate delivery chamber or the substrate takeup chamber in a roll-to-roll type plasma CVD apparatus in which an electrically conductive web substrate is delivered from a roll comprising said electrically conductive web substrate and an interleaf alternately wound, a plurality of functional films are sequentially formed on the web substrate delivered, and the web substrate having functional deposited films formed thereon is wound in a roll form together with an interleaf such that the interleaf is laid on the film-bearing face of the web substrate.

The term "revolution abnormality" in the present invention means a sudden change in the revolution speed of the interleaf bobbin (the interleaf takeup bobbin and the interleaf delivery bobbin). The "sudden change" is meant to include reverse rotation, stopping and the like.

Figure 3:
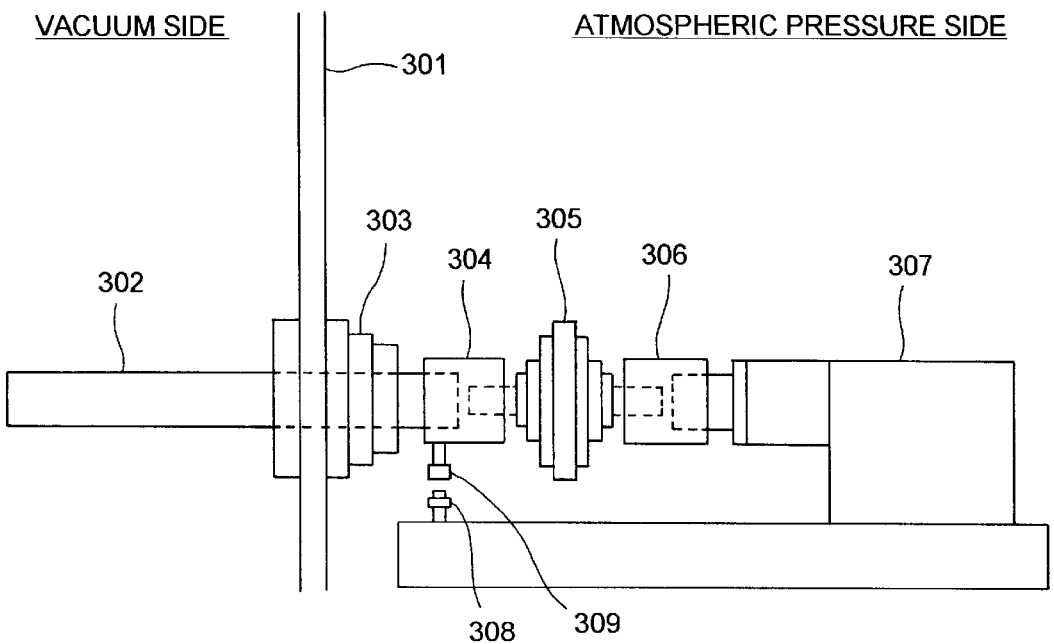
FIG. 3 is a schematic view illustrating an example of a rotation system of an interleaf bobbin used in a substrate-processing apparatus according to the present invention.

In FIG. 3, there is shown an example of a rotation system of an interleaf bobbin [an interleaf delivery bobbin (105) or an interleaf takeup bobbin (205)] used in a substrate-processing apparatus according to the present invention.

In FIG. 3, reference numeral 301 indicates a chamber wall, reference numeral 302 an interleaf bobbin an interleaf delivery bobbin or an interleaf takeup bobbin), reference numeral 303 a vacuum magnetic sealing flange, reference numeral 304 a coupling, reference numeral 305 a clutch, reference numeral 306 a coupling, reference numeral 307 a motor, reference numeral 308 a proximity sensor, and reference numeral 309 a dog.

As shown in FIG. 3, as a means of detecting revolution abnormality of the interleaf bobbin 302 from the atmospheric pressure side, a pair of identifiable dogs 309 are arranged at the coupling 304 provided between the vacuum magnetic sealing flange 303 and the clutch 305 and a proximity sensor 308 is arranged right under the coupling at which the pair of identifiable dogs 309 are arranged.

Figure 4:
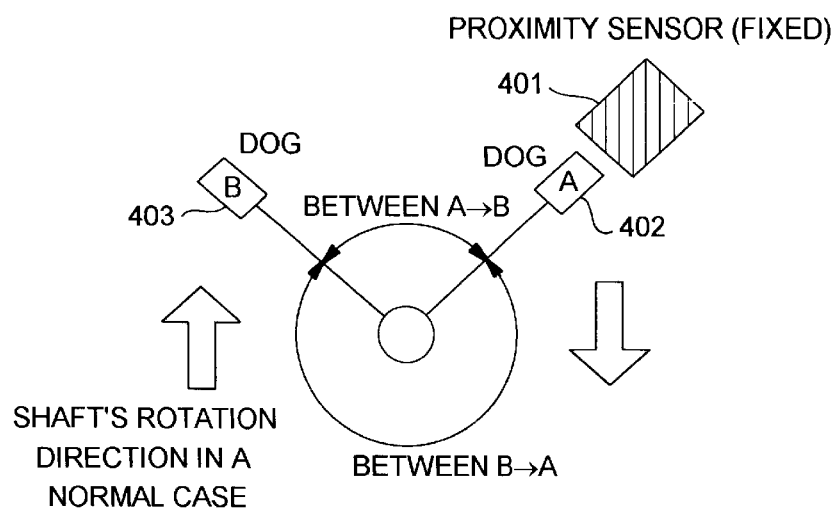
FIG. 4 is a schematic principle view for explaining a mechanism of detecting rotation abnormality of an interleaf bobbin, which is used in a substrate-processing apparatus according to the present invention.

FIG. 4 is a schematic principle view for explaining the mechanism of detecting rotation abnormality (reverse rotation or stopping) of the interleaf bobbin.

Specifically, as shown in FIG. 4, the pair of identifiable dogs 309 (dog A 402 and dog B 403) are arranged so as to have a positional relationship of 90° between them, and they are rotated at the same rotation speed as that of the interleaf.

Now, in FIG. 4, in the case where the duration since the dog A has passed a proximity sensor 401 until the dog B passes the proximity sensor is made to be $t_{AB}$ and the duration since the dog B has passed the proximity sensor until the dog A passes the proximity sensor is made to be $t_{BA}$, when the equation $t_{BA}-(t_{AB}\times 2)$ provided a negative value, it is determined that the interleaf was reversed. When the equation provides a positive value, it is determined that the interleaf bobbin is being normally rotated.

Separately, in the case where the equation $t_{BA}+t_\alpha$ (t:an optionally set time) is timer-set as a stopping detection time, when the stopping time is time-upped or neither the dog A nor the dog B passes the proximity sensor, it is determined that the rotation of the interleaf bobbin is stopped.

In addition, in order to avoid the malfunction, the system is designed not to detect revolution abnormality of the interleaf bobbin for 60 seconds after the commencement of the transportation of the web substrate. This means that the detection of revolution abnormality of the interleaf bobbin is performed after the transportation of the web substrate became constant at a prescribed transportation speed. Further, the system is designed such that the detection of revolution abnormality of the interleaf bobbin is performed other than the time when the web substrate is usually transported.

Now, when revolution abnormality of the interleaf bobbin is detected, an alarm is given and abnormality contents are indicated on a display panel (not shown), and when the abnormal state is continued for more than 1 second, the discharge in all of the discharging chambers, the transportation of the web substrate and the rotation of the interleaf bobbin are suspended. By this, it is possible to prevent occurrence of a problem in that the breakage of the interleaf due to revolution abnormality of the interleaf bobbin or the interleaf is taken into the first film-forming chamber situated next to the substrate delivery chamber. This situation previously prevents the film-forming apparatus from being damaged. And even when the process of processing the web substrate is suspended due to revolution abnormality of the interleaf bobbin (that is, transport abnormality of the interleaf) as above described, the cause of the abnormality of the interleaf can be promptly repaired by returning the interleaf to be in an normal state, where the process of processing the web substrate can be promptly restarted.

In this embodiment, the detection of revolution abnormality of the interleaf bobbin (the interleaf takeup bobbin and the interleaf delivery bobbin) is performed on the atmospheric pressure side (that is, outside the chamber). However, it is possible to be designed such that the detection of revolution abnormality of the interleaf bobbin is performed in the vacuum side (that is, in the chamber).

In the following, the present invention will be described in more detail with reference to examples. It should be understood that these examples are only for illustrative purposes and the scope of the present invention is not restricted to these examples.

EXAMPLE 1

Figure 5:
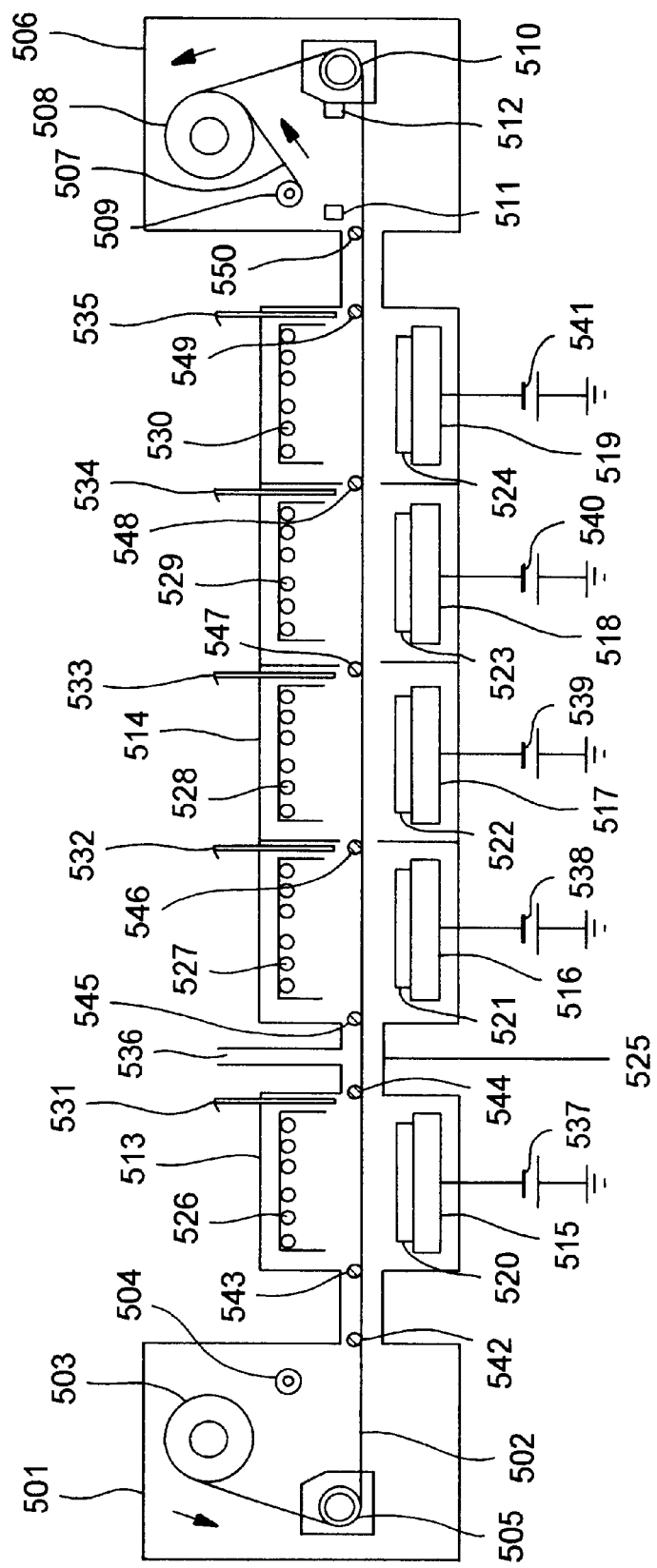
FIG. 5 is a schematic diagram illustrating a roll-to-roll type DC magnetron sputtering apparatus as an example of a substrate-processing apparatus according to the present invention.
Figure 6:
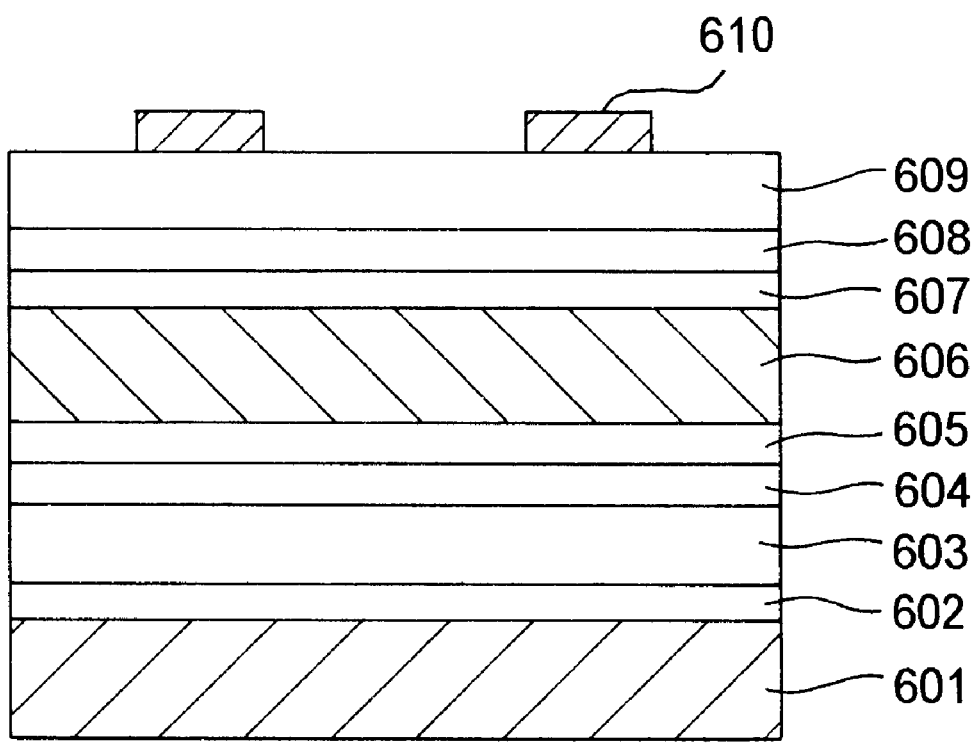
FIG. 6 is a schematic cross-sectional view illustrating an example of an amorphous silicon solar cell (photovoltaic element) produced in the present invention.

In this example, using the roll-to-roll type DC magnetron sputtering apparatus shown in FIG. 5, a two-layered back reflecting layer (602, 603) of a single cell type amorphous silicon solar cell shown in FIG. 6 was formed. In FIG. 6, reference numeral 601 indicates a substrate, reference numeral 602 a metal reflecting layer, reference numeral 603 a transparent oxide layer, each of reference numerals 604 to 608 a semiconductor layer, reference numeral 609 a transparent electrically conductive layer, and reference numeral 610 a collecting electrode (or a grid electrode).

In this example, in substrate takeup chamber 506 of the apparatus shown in FIG. 5 (the substrate takeup chamber 506 is corresponding to the substrate takeup chamber 101 shown in FIG. 1), an interleaf slack abnormality-detecting mechanism comprising a pair of a light emitting laser sensor 511 and a light receiving laser sensor 512 was provided, and an interleaf bobbin revolution abnormality (reverse rotation, stopping)-detecting mechanism of the configuration shown in FIG. 3 was provided in the revolution system of interleaf delivery bobbin 509 (which is corresponding to the interleaf delivery bobbin 105 in FIG. 1).

First, a substrate delivery bobbin 503 having a sufficiently-cleaned stainless web substrate 502 (width: 355.6 mm, thickness: 0.15 mm, length: 1000 m) wound thereon in a roll form with no interleaf was set in substrate delivery chamber 501 having a steering roller 505 provided therein. Reference numeral 504 indicates an interleaf takeup bobbin. The interleaf takeup bobbin 504 was not used in this example.

In the substrate takeup chamber 506, there were arranged a substrate takeup bobbin 508 having anything wound thereon and an interleaf delivery bobbin 509 having an interleaf 507 [comprising a polyester film with aluminum vacuum-deposited thereon (width: 355.6 mm, thickness: 0.05 mm, length: 1000 m)] wound thereon in a roll form.

The web substrate was delivered from the substrate delivery bobbin 503, followed by passing it through film-forming chambers 513 and 514 to enter into the substrate takeup chamber 506 where the beginning portion of the web substrate was fixed to and wound on the substrate takeup bobbin 508. The transportation system of the web substrate was adjusted so that the web substrate could be continuously transported from the substrate delivery chamber to the substrate takeup chamber without being deflected.

Then, the inside of the apparatus was evacuated until the inner pressure became less than 0.01 Pa by means of a vacuum pump (not shown).

Thereafter, through respective gas feed pipes 531–535, inert gas (argon gas) was supplied into the metal reflecting layer-forming chamber 513 and the transparent oxide layer-forming chamber 514 at a flow rate of 50 sccm. While maintaining this state, the openings of exhaust valves (not shown) were adjusted to maintain the inner pressure of each chamber at 0.3 Pa. After this, using heater units 526–530, the thermocouples were contacted with the back face (the non-film-forming face) of the web substrate and the web substrate was heated to and maintained at 250° C. while performing temperature control. Successively, the web substrate started moving at a transportation speed of 1270 mm/minute while applying a tensile force of 60 Kg thereto.

In the metal reflecting layer-forming chamber 513, a target 520 comprising an aluminum (purity: 99.99 wt. %) was used. And by applying a D.C. power of 2 KW from a D.C. power source 537 to a cathode electrode 515 to spitter the target 520, a 0.2 $\mu$m thick aluminum metal reflecting layer 602 on the web substrate 502 (as the substrate 601 in FIG. 6). In the transparent oxide layer-forming chamber 514, targets 521–524 each comprising a zinc oxide (ZnO) were used. And by applying a D.C. power of 1.5 KW from each of D.C. power sources 538–541 to each of cathode electrodes 516–519 to sputter the targets 521–524, a 1.0 $\mu$m thick transparent oxide (zinc oxide) layer 603 on the metal reflecting layer 602. Thus, there was formed a two-layered back reflecting layer (comprising the aluminum metal reflecting layer 602 and the transparent oxide (zinc oxide) layer 603) on the web substrate 502 as the substrate 601 (see, FIG. 6).

In FIG. 5, each of reference numerals 542–550 indicates a substrate-transporting magnet roller, reference numeral 525 a gas gate, and reference numeral 536 a gate gas feed pipe.

The once (one roll) film formation time was about 10 hours. During the once film formation, by means of the interleaf slack abnormality-detecting mechanism (comprising the light emitting laser sensor 511 and the light receiving laser sensor 512 and the interleaf bobbin revolution abnormality-detecting mechanism of the configuration shown in FIG. 3, detection was conducted of whether or not transport abnormality of the interleaf was occurred. However, no transport abnormality of the interleaf was occurred during the once film formation. Then, the film formation was repeated for 100 rolls (about 1000 hours), during which detection was conducted of whether or not transport abnormality of the interleaf was occurred in the same manner as in the above, and as a result, transport abnormality of the interleaf due to slack of the interleaf was detected. When the transport abnormality was detected, the discharge in all the film-forming chambers, the transportation of the web substrate, and the rotation of the interleaf bobbin were suspended, and through a viewing port (not shown) in the substrate takeup chamber 506, the inside of the substrate takeup chamber was observed. As a result, it was found that the deflected interleaf was stopped before the steering roller 510, and breakage or the like were not occurred at the interleaf. Thereafter, immediately after the substrate takeup chamber 506 was leaked and the interleaf was adjusted to be in a normal state, the apparatus was promptly returned to be in a state capable of performing the film formation to restart the formation of the two-layered back reflecting layer.

Based on this result, it was found that the mechanism of detecting transport abnormality of the interleaf according to the present invention is practically effective for preventing occurrence of trouble(s) in the film-formning apparatus due to transport abnormality of the interleaf.

EXAMPLE 2

Figure 7:
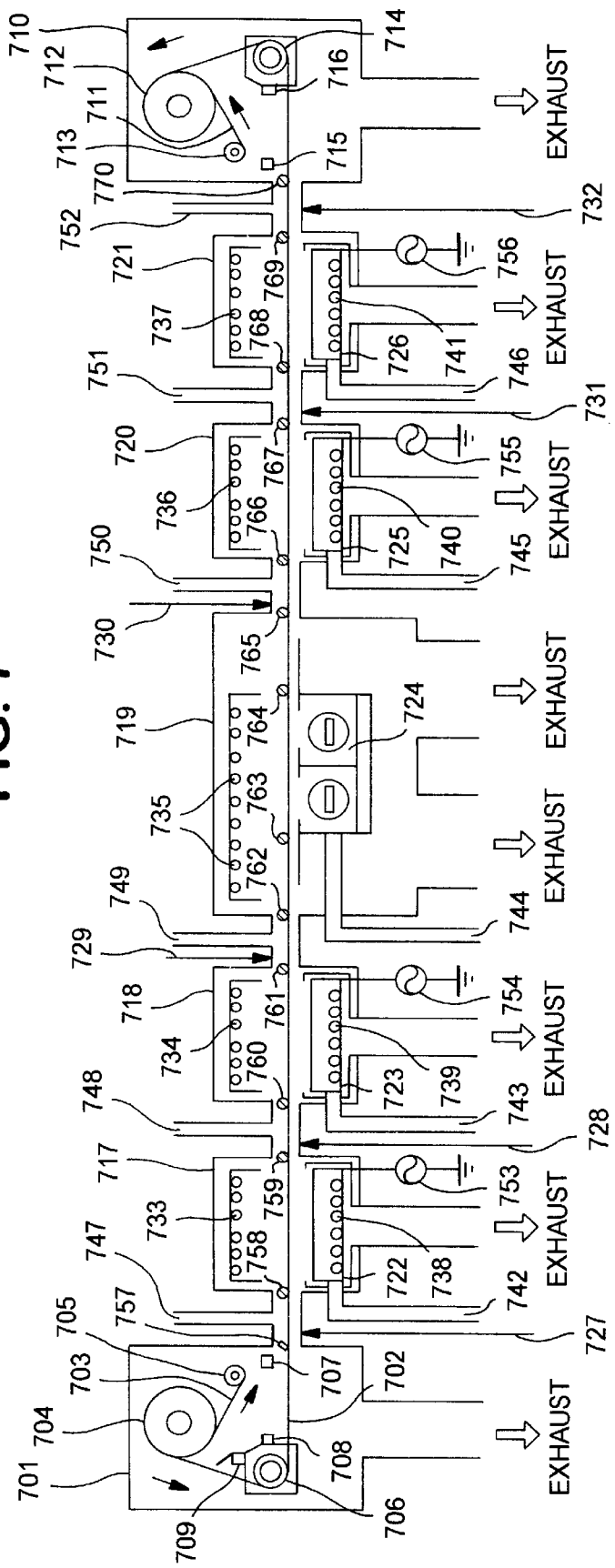
FIG. 7 is a schematic diagram illustrating a roll-to-roll type plasma CVD apparatus as an example of a substrate-processing apparatus according to the present invention.

In this example, using one of the rolls obtained in Example 1, each roll comprising the web substrate (502) having the two-layered back reflecting layer (comprising the aluminum metal reflecting layer 602 and the transparent oxide (zinc oxide) layer 603) formed thereon wound together with the interleaf (507) [comprising the polyester film with aluminum vacuum-deposited thereon] in a roll form, the semiconductor layers 604–608 of the single cell type amorphous silicon solar cell shown in FIG. 6 were sequentially formed on the two-layered back reflecting layer by the roll-to-roll type plasma CVD apparatus shown in FIG. 7.

In FIG. 7, reference numeral 701 indicates a substrate delivery chamber (having such constitution as shown in FIG. 2), reference numeral 702 a web substrate (corresponding to the web substrate 502 in Example 1), reference numeral 703 an interleaf (corresponding to the interleaf 507 in Example 1), reference numeral 704 a substrate delivery ribbon (comprising aforesaid one of the rolls obtained in Example 1), reference numeral 705 an interleaf takeup bobbin, reference numeral 706 a steering roller, reference numeral 707 a light emitting laser sensor, reference numeral 708 a light receiving laser sensor, reference numeral 709 a limit switch.

Reference numeral 717 indicates a film-forming chamber for forming an n-type semiconductor layer using RF power, reference numeral 718 a film-forming chamber for forming an i-type semiconductor layer using RF power, reference numeral 719 a film-forming chamber for forming an i-type semiconductor layer using microwave (MW) power, reference numeral 720 a film-forming chamber for forming an i-type semiconductor layer using RF power, and reference numeral 721 a film-forming chamber for forming a p-type semiconductor layer using RF power. Reference numeral 724 indicates a discharge region provided in the film-forming chamber 719.

Reference numeral 710 indicates a substrate takeup chamber (having such constitution as shown in FIG. 1), reference numeral 711 an interleaf, reference numeral 712 a substrate takeup bobbin (having anything wound thereon), reference numeral 713 an interleaf delivery bobbin having the interleaf 711 wound thereon in a roll form, reference numeral 714 a steering roller, reference numeral 715 a light emitting laser sensor, and reference numeral 716 a light receiving laser sensor.

In this example, in the substrate delivery chamber 701 of the apparatus shown in FIG. 7, an interleaf slack abnormality-detecting mechanism comprising a pair of a light emitting laser sensor 707 and a light receiving laser sensor 708 and an interleaf adhesion-detecting mechanism comprising a limit switch 709 were arranged. In addition, an interleaf bobbin revolution abnormality-detecting mechanism of the configuration shown in FIG. 3 was provided in the revolution system of the interleaf takeup bobbin 705.

Further, in the substrate takeup chamber 710, an interleaf slack abnormality-detecting mechanism comprising a pair of a light emitting laser sensor 715 and a light receiving laser sensor 716 was arranged. In addition, an interleaf bobbin revolution abnormality-detecting mechanism of the configuration shown in FIG. 3 was provided in the revolution system of the interleaf delivery bobbin 713.

The film formation using the apparatus shown in FIG. 7 was conducted as follows.

In the substrate delivery chamber 701, a substrate delivery bobbin 704 having the foregoing one of the rolls obtained in Example 1 thereon was set. In the substrate takeup chamber 710, a substrate takeup bobbin 712 having nothing wound thereon and an interleaf delivery bobbin 713 having an interleaf 711 [comprising a polyester film with aluminum vacuum-deposited thereon (width: 355.6 mm, thickness: 0.05 mm, length: 1000 m)] wound thereon in a roll form were set.

The web substrate 702 having the two-layered back reflecting layer thereon was delivered together with the interleaf 703 from the substrate delivery bobbin 703, where the interleaf was delivered separately from the web substrate 702 and the interleaf delivered was successively wound on the interleaf takeup bobbin 705, and the web substrate 702 delivered was followed by passing through the film-forming chambers 717–721 to enter into the substrate takeup chamber 710 where the beginning portion of the web substrate was fixed to and wound on the substrate takeup bobbin 712. In the takeup chamber 710, upon winding the web substrate 702 on the substrate takeup bobbin 712, the interleaf 711 was delivered from the interleaf delivery bobbin 713 and it was wound on the substrate takeup bobbin 712 together with the web substrate 702 so that the film-forming face of the web substrate was covered by the interleaf.

The transportation system of the web substrate was adjusted so that the web substrate could be continuously transported from the substrate delivery chamber to the substrate takeup chamber without being deflected.

Then, the inside of the apparatus was evacuated until the inner pressure of each of the film-forming chambers 717–721 became less than 1 mTorr ($1.33 \times 10^{-1}$ Pa) by means of a vacuum pump (not shown).

Thereafter, through respective gate gas feed pipes 747–752, inert gas (helium gas) was flown into respective gas gates 727–732 at a flow rate of 150 sccm. While maintaining this state, the openings of exhaust valves (not shown) were adjusted to maintain the inner pressure of each film-forming chamber at 1 Torr (133 Pa). After this, using heater units 733–737, the web substrate was heated to and maintained at 300° C. while performing temperature control. While maintaining this state, baking was conducted for 4 hours to release impurity gases present in each of the film-forming chambers 717–721. Then, each of the heater units 733–737 was regulated so that the film-forming temperature in each film-forming chamber became a prescribed temperature, and thereafter, the inside of each film-forming chamber was heated by means of the corresponding heater unit.

Thereafter, the introduction of the helium gas was terminated, and through gas feed pipes 742–746, prescribed film-forming raw material gas was introduced into each of the film-forming camber 717–721 at a prescribed flow rate. Further, through the gate gas feed pipes 747–752, hydrogen gas ($H_2$ gas) was flown into the gas gates 727–732 at a flow rate of 1000 sccm.

Successively, the web substrate started moving at a transportation speed of 1270 mm/minute while applying a tensile force of 80 Kg thereto.

Thereafter, to each of cathode electrodes 722, 723, 725 and 726 in the film-forming chambers 717, 718, 720 and 721, a prescribed RF (high frequency) power was applied from each of RP power sources 753, 754, 755 and 756. And a prescribed microwave power from a microwave power source (not shown) and a prescribed RF bias power from an RF power source (not shown) were introduced into the discharge region 724. Thus, on the two-layered back reflecting layer of the web substrate which was moving, there were continuously formed an n-type semiconductor layer 604 comprising an amorphous silicon (a-Si) material in the film-forming chamber 717, an i-type semiconductor layer 605 comprising an a-Si material in the film-forming chamber 718, an i-type semiconductor layer 606 comprising an amorphous silicon-germanium (a-SiGe) material in the film-forming chamber 719, an i-type semiconductor layer 607 comprising an a-Si material in the film-forming chamber 720, and a p-type semiconductor layer 608 comprising a microcrystalline silicon ($\mu$c-Si) material in the film-forming chamber 721.

In FIG. 7, each of reference numerals 757–770 indicates a substrate-transporting magnet roller.

The once (one roll) film formation time was about 10 hours. During the once film formation, by means of the interleaf slack abnormality-detecting mechanism comprising the light emitting laser sensor 707 and the light receiving laser sensor 708 and the interleaf adhesion-detecting mechanism comprising the limit switch 709 which were provided in the substrate delivery chamber 701 and the interleaf bobbin revolution abnormality-detecting mechanism of the configuration shown in FIG. 3 which was provided in the revolution system of the interleaf takeup bobbin 705 in the substrate delivery chamber 701, and also by means of the interleaf slack abnormality-detecting mechanism comprising the light emitting laser sensor 715 and the light receiving laser sensor 716 which was provided in the substrate takeup chamber 710 and the interleaf bobbin revolution abnormality-detecting mechanism of the configuration shown in FIG. 3 which was provided in the revolution system of the interleaf delivery bobbin 713 of the substrate takeup chamber 710, detection was conducted of whether or not transport abnormality of the interleaf was occurred. However, no transport abnormality of the interleaf was occurred during the once film formation.

Then, the film formation was repeated for 100 rolls (about 1000 hours), during which detection was conducted of whether or not transport abnormality of the interleaf was occurred in the same manner as in the above, and as a result, in the substrate delivery chamber 701, transport abnormality of the interleaf due to adhesion of the interleaf 705 (comprising the polyester film with aluminum vacuum-deposited thereon) was detected. When the transport abnormality was detected, the discharge in all the film-forming chambers, the transportation of the web substrate, and the rotation of the interleaf bobbins were suspended, and through a viewing port (not shown) in the substrate delivery chamber 701, the inside of the substrate delivery chamber was observed. As a result, it was found that the adhered interleaf was stopped before the steering roller 706, and breakage or the like were not occurred at the interleaf.

Separately, besides the film-formation wherein the adhesion of the interleaf was detected, in the film formation another roll, transport abnormality of the interleaf due to slack thereof was detected in the substrate delivery chamber 701. When the transport abnormality was detected, the discharge in all the film-forming chambers, the transportation of the web substrate, and the rotation of the interleaf bobbins were suspended, and through the viewing port (not shown) in the substrate delivery chamber 701, the inside of the substrate delivery chamber was observed. As a result, it was found that the deflected interleaf was stopped before the entrance of the gas gate 727 between the substrate delivery chamber 701 and the film-forming chamber 717 situated next to the substrate delivery chamber and the interleaf was not taken into the film-forming chamber 717. Thereafter, immediately after the substrate delivery chamber 701 was leaked and the bearings (not shown) of the interleaf takeup bobbin 705 were replaced by new bearings, the apparatus was returned to be in a state capable of performing the film formation to restart the formation of the semiconductor layers 604–608.

Based on the results, it was found that the mechanism of detecting transport abnormality of the interleaf according to the present invention is practically effective for previously preventing occurrence of trouble(s) in the film-forming apparatus due to transport abnormality of the interleaf.

Using randomly selected one of the rolls obtained in the above, on the p-type semiconductor layer 608 of the substrate, a transparent electrically conductive layer 609 and a grid electrode 610 were sequentially formed by a conventional manner to obtain a number of single cell type amorphous silicon solar cells. These solar cells were found to be satisfactory in solar cell characteristics.

REFERENCE EXAMPLE

In this reference example, the procedures of Example 2 were repeated, except that without providing such mechanisms of detecting transport abnormality of the interleaf as used in Example 2 in the substrate delivery chamber and the substrate takeup chamber, the semiconductor layers 604–608 were sequentially formed on the web substrate. That is, in this reference example, in order to substitute those detecting mechanisms used in Example 2, without employing such sequence in Example 2 in which the discharge in all the film-forming chambers, the transportation of the web substrate and the rotation of the interleaf bobbins are suspended when transport abnormality of the interleaf is detected, there were used means which gives an alarm and indicates contents of transport abnormality of the interleaf when the transport abnormality of the interleaf is occurred.

When slack abnormality of the interleaf was occurred in the substrate delivery chamber 701, an alarm was given. After 10 seconds since the alarm was given, the operator suspended the discharge in all the film-forming chambers, the transportation of the web substrate, and the rotation of the interleaf bobbins. Then, through the viewing port (not shown) in the substrate delivery chamber 701, the inside of the substrate delivery chamber was observed. As a result, it was found that the deflected interleaf was taken into the gas gate 727 between the substrate delivery chamber 701 and the film-forming chamber 717 situated next to the substrate delivery chamber in such a state that the interleaf was mounted on the web substrate. And the inside of the apparatus was leaked and the inside of the film-forming chamber 717 was observed. As a result, it was found that the interleaf reached near the center of the inside of the film-forming chamber, where the interleaf was melted by the heat from the heater unit and the aluminum of the interleaf was deposited on the inner wall face of the film-forming chamber and also on the components in the film-forming chamber. Thus, the film formation in the apparatus could not be restarted.

As apparent also from the results in this reference example, it is understood that the mechanism of detecting transport abnormality of the interleaf according to the present invention is indispensable and practically effective in a roll-to-roll type substrate-processing apparatus in order to previously prevent occurrence of trouble(s) due to transport abnormality of the interleaf in the apparatus.

As detailed in the above, in the present invention, by installing the foregoing mechanism(s) of detecting transport abnormality of the interleaf in a roll-to-roll type substrate-processing apparatus, it is possible to previously prevent occurrence of trouble(s) due to transport abnormality of the interleaf during the processing of the substrate which is continuously conducted over a long period of time whereby preventing the apparatus from being damaged. It is also possible to previously prevent occurrence of any troubles due to breakage or the like of the interleaf. This situation makes it possible to realize a substrate-processing apparatus and a substrate-processing method which enable to efficiently and continuously process a given substrate in a desired state at an improved yield. In addition, according to the present invention, it is possible to realize a film-forming apparatus and a film-forming method which enable to efficiently and continuously form not only a high quality functional deposited film (or a semiconductor film) having satisfactory characteristics but also a high quality photovoltaic element (or a high quality solar cell) having satisfactory characteristics on a long substrate at an improved yield.

What is claimed is:

1. A substrate-processing apparatus, comprising:
   a substrate delivery chamber;
   a substrate-processing chamber,
   said substrate delivery chamber having a substrate delivery bobbin and an interleaf takeup bobbin provided therein, said substrate delivery bobbin having a roll comprising a web substrate and an interleaf alternately wound thereon, wherein in said substrate delivery chamber, the web substrate and the interleaf are delivered from said delivery bobbin while said web substrate delivered is transported into said substrate-processing chamber and the interleaf delivered is wound on said interleaf takeup bobbin, said web substrate transported into said substrate-processing chamber is subjected to desired processing in said substrate-processing chamber; and
   a mechanism, disposed within said substrate delivery chamber, for detecting transport abnormality of the interleaf in said substrate delivery chamber, the abnormality due to slacking abnormality in the interleaf, adhesion abnormality in the interleaf or revolution abnormality in winding or unwinding the interleaf.

2. A substrate-processing apparatus according to claim 1, wherein said mechanism for detecting transport abnormality of the interleaf is a means for detecting slack of the interleaf between said substrate delivery bobbin and said interleaf takeup bobbin in said substrate delivery chamber.

3. A substrate-processing apparatus according to claim 1, wherein said mechanism for detecting transport abnormality of the interleaf is a means for detecting adhesion of the interleaf to the web substrate.

4. A substrate-processing apparatus according to claim 1, wherein said mechanism for detecting transport abnormality of the interleaf is a means for detecting revolution abnormality of said interleaf takeup bobbin.

5. A substrate-processing apparatus according to claim 1, wherein said mechanism for detecting transport abnormality of the interleaf has an optical sensor, a physical sensor or a revolution speed detector of said interleaf takeup bobbin.

6. A substrate-processing apparatus according to claim 1, wherein said mechanism for detecting transport abnormality of the interleaf has a laser sensor.

7. A substrate-processing apparatus according to claim 1, wherein said mechanism for detecting transport abnormality of the interleaf has a limit switch.

8. A substrate-processing apparatus according to claim 1, further comprising a mechanism for preventing the interleaf from contacting the web substrate at a position other than the roll.

9. A substrate-processing apparatus according to claim 8, wherein said mechanism for detecting transport abnormality of the interleaf and said mechanism for preventing the interleaf from contacting with the web substrate comprises a common member.

10. A substrate-processing apparatus according to claim 8, wherein said mechanism for preventing the interleaf from contacting with the web substrate has a tray, a mesh member or a bar-like member.

11. A substrate-processing apparatus according to claim 1, wherein said substrate-processing chamber is a film-forming chamber.

12. A substrate-processing apparatus according to claim 1, wherein said substrate-processing chamber is a chamber for processing the web substrate using plasma.

13. A substrate-processing apparatus according to claim 1, wherein said substrate-processing chamber has a substrate-heating mechanism.

14. A substrate-processing apparatus according to claim 1, wherein said substrate-processing chamber is a plasma chemical vapor deposition chamber.

15. A substrate-processing apparatus according to claim 1, wherein said substrate-processing chamber is a sputtering chamber.

16. A substrate-processing apparatus, comprising:
   a substrate-processing chamber for processing a web substrate therein;
   a substrate takeup chamber having a substrate takeup bobbin and an interleaf delivery bobbin provided therein, wherein the web substrate processed in said substrate-processing chamber is transported into said substrate takeup chamber where the web substrate and an interleaf delivered from said interleaf delivery bobbin are alternately wound in a roll form on said substrate takeup bobbin; and
   a mechanism, disposed within said substrate takeup chamber, for detecting transport abnormality of the interleaf in said substrate takeup chamber, the abnormality due to slacking abnormality in the interleaf, adhesion abnormality in the interleaf or revolution abnormality in winding or unwinding the interleaf.

17. A substrate-processing apparatus according to claim 16, wherein the mechanism for detecting transport abnormality of the interleaf is a means for detecting slack of the interleaf between said substrate takeup bobbin and said interleaf delivery bobbin in said substrate takeup chamber.

18. A substrate-processing apparatus according to claim 16, wherein said mechanism for detecting transport abnormality of the interleaf is a means for detecting adhesion of the interleaf to the web substrate.

19. A substrate-processing apparatus according to claim 16, wherein said mechanism for detecting transport abnormality of the interleaf is a means for detecting revolution abnormality of the interleaf delivery bobbin.

20. A substrate-processing apparatus according to claim 16, wherein said mechanism for detecting transport abnormality of the interleaf has an optical sensor, a physical sensor or a revolution speed detector of said interleaf delivery bobbin.

21. A substrate-processing apparatus according to claim 16, wherein said mechanism for detecting transport abnormality of the interleaf has a laser sensor.

22. A substrate-processing apparatus according to claim 16, wherein said mechanism for detecting transport abnormality of the interleaf has a limit switch.

23. A substrate-processing apparatus according to claim 16, further comprising a mechanism for preventing the interleaf from contacting with the web substrate at a position other than the roll form.

24. A substrate-processing apparatus according to claim 23, wherein said mechanism for detecting transport abnormality of the interleaf and said mechanism for preventing the interleaf from contacting with the web substrate comprises a common member.

25. A substrate-processing apparatus according to claim 23, wherein said mechanism for preventing the interleaf from contacting with the web substrate has a tray, a mesh member or a bar-like member.

26. A substrate-processing apparatus according to claim 16, wherein said substrate-processing chamber is a film-forming chamber.

27. A substrate-processing apparatus according to claim 16, wherein said substrate-processing chamber is a chamber for processing the web substrate using plasma.

28. A substrate-processing apparatus according to claim 16, wherein said substrate-processing chamber has a substrate-heating mechanism.

29. A substrate-processing apparatus according to claim 16, wherein said substrate-processing chamber is a plasma chamber vapor deposition chamber.

30. A substrate-processing apparatus according to claim 16, wherein said substrate-processing chamber is a sputtering chamber.

31. A substrate-processing apparatus, comprising:
   a substrate delivery chamber having a substrate delivery bobbin and an interleaf takeup bobbin provided therein, said substrate delivery bobbin having a roll comprising a web substrate and an interleaf alternately wound in a roll form thereon;
   a substrate-processing chamber in which the web substrate is subjected to desired processing;
   a substrate takeup chamber having a substrate takeup bobbin and an interleaf delivery bobbin provided therein,
   wherein in said substrate delivery chamber, the web substrate and the interleaf are continuously delivered from said substrate delivery bobbin while the web substrate delivered is transported into said substrate-processing chamber and the interleaf delivered is wound on said interleaf takeup bobbin; and in said substrate takeup chamber, the web substrate transported from said substrate-processing chamber and an interleaf delivered from said interleaf delivery bobbin are alternately wound in a roll form on said substrate takeup bobbin; and
   a mechanism, disposed within the apparatus, for detecting transport abnormality of the interleaf at least either in said substrate delivery chamber or in said substrate takeup chamber, the abnormality due to slacking abnormality in the interleaf, adhesion abnormality in the interleaf or revolution abnormality in winding or unwinding the interleaf.

32. A substrate-processing apparatus according to claim 31, wherein said mechanism for detecting transport abnormality of the interleaf is a means for detecting slack of the interleaf between said substrate delivery bobbin and said interleaf takeup bobbin in said substrate delivery chamber or/and between said substrate takeup bobbin and said interleaf delivery bobbin in said substrate takeup chamber.

33. A substrate-processing apparatus according to claim 31, wherein said mechanism for detecting transport abnormality of the interleaf is a means for detecting adhesion of the interleaf to the web substrate.

34. A substrate-processing apparatus according to claim 31, wherein said mechanism for detecting transport abnormality of said interleaf is a means for detecting revolution abnormality of said interleaf takeup bobbin or/and said interleaf delivery bobbin.

35. A substrate-processing apparatus according to claim 31, wherein said mechanism for detecting transport abnormality of the interleaf has an optical sensor, a physical sensor or a revolution speed detector of said interleaf delivery bobbin.

36. A substrate-processing apparatus according to claim 31, wherein said mechanism for detecting transport abnormality of the interleaf has a laser sensor.

37. A substrate-processing apparatus according to claim 31, wherein said mechanism for detecting transport abnormality of the interleaf has a limit switch.

38. A substrate-processing apparatus according to claim 31, further comprising a mechanism for preventing the interleaf from contacting with the web substrate at a position other than the roll in said substrate delivery chamber or/and at a position other than the roll form in said substrate takeup chamber.

39. A substrate-processing apparatus according to claim 38, wherein said mechanism for detecting transport abnormality of the interleaf and said mechanism for preventing the interleaf from contacting with the web substrate comprises a common member.

40. A substrate-processing apparatus according to claim 38, wherein said mechanism for preventing the interleaf from contacting with the web substrate has a tray, a mesh member or a bar-like member.

41. A substrate-processing apparatus according to claim 31, wherein said substrate-processing chamber is a film-forming chamber.

42. A substrate-processing apparatus according to claim 31, wherein said substrate-processing chamber is a chamber for processing the web substrate using plasma.

43. A substrate-processing apparatus according to claim 31, wherein said substrate-processing chamber has a substrate-heating mechanism.

44. A substrate-processing apparatus according to claim 31, wherein said substrate-processing chamber is a plasma chemical vapor deposition chamber.

45. A substrate-processing apparatus according to claim 31, wherein said substrate-processing chamber is a sputtering chamber.

* * * * *

UNITED STATES PATENT AND TRADEMARK OFFICE
CERTIFICATE OF CORRECTION

PATENT NO. : 6,602,347 B1
DATED : August 5, 2003
INVENTOR(S) : Hiroshi Shimoda et al.

It is certified that error appears in the above-identified patent and that said Letters Patent is hereby corrected as shown below:

Column 1,
Line 14, "purpose)." should read -- purposes). --.

Column 2,
Line 25, "on e" should read -- on a --.

Column 3,
Line 1, "loosed" should read -- loosened --.

Column 8,
Line 28, "sensors" should read -- sensor --.
Line 50, "to previously" should read -- to --.

Column 9,
Line 27, "substrate-and" should read -- substrate and --.

Column 10,
Line 2, "103'0" should read -- 103' --.
Line 61, "sensor" should read -- sensors --, and "as." should read -- as --.

Column 11,
Line 11, "blow" should read -- below --.

Column 13,
Line 25, "an interleaf" should read -- (an interleaf --.

UNITED STATES PATENT AND TRADEMARK OFFICE
CERTIFICATE OF CORRECTION

PATENT NO. : 6,602,347 B1
DATED : August 5, 2003
INVENTOR(S) : Hiroshi Shimoda et al.

It is certified that error appears in the above-identified patent and that said Letters Patent is hereby corrected as shown below:

Column 15,
Line 33, "spitter" should read -- sputter --.

Coumn 18,
Line 2, "camber" should read -- chambers --.

Signed and Sealed this

Twenty-fourth Day of August, 2004

JON W. DUDAS
*Director of the United States Patent and Trademark Office*